United States Patent
Hedler et al.

(10) Patent No.: US 7,514,273 B2
(45) Date of Patent: Apr. 7, 2009

(54) METHOD FOR APPLYING REWIRING TO A PANEL WHILE COMPENSATING FOR POSITION ERRORS OF SEMICONDUCTOR CHIPS IN COMPONENT POSITIONS OF THE PANEL

(75) Inventors: Harry Hedler, Germering (DE); Jens Pohl, Bernhardswald (AT); Holger Woerner, Regensburg (DE)

(73) Assignee: Qimonda AG, Munich (DE)

( * ) Notice: Subject to any disclaimer, the term of this patent is extended or adjusted under 35 U.S.C. 154(b) by 416 days.

(21) Appl. No.: 10/566,454

(22) PCT Filed: Jun. 28, 2004

(86) PCT No.: PCT/DE2004/001360

§ 371 (c)(1),
(2), (4) Date: Aug. 7, 2006

(87) PCT Pub. No.: WO2005/015634

PCT Pub. Date: Feb. 17, 2005

(65) Prior Publication Data

US 2007/0249067 A1    Oct. 25, 2007

(30) Foreign Application Priority Data

Jul. 28, 2003   (DE) ................................ 103 34 577

(51) Int. Cl.
*H01L 21/20* (2006.01)

(52) U.S. Cl. ............................ 438/14; 438/16; 438/106; 438/118; 438/127; 257/E23.169; 257/E23.173; 257/E23.178; 257/E29.255

(58) Field of Classification Search .................. 438/14, 438/16, 17, 18, 106, 118, 127; 257/E23.169, 257/173, 178, E29.255
See application file for complete search history.

(56) References Cited

U.S. PATENT DOCUMENTS

| | | | |
|---|---|---|---|
| 3,650,796 | A | 3/1972 | Jackson et al. |
| 4,835,704 | A | 5/1989 | Eichelberger et al. |
| 5,357,403 | A | 10/1994 | Haller et al. |
| 2003/0124767 | A1 | 7/2003 | Lee et al. |
| 2004/0089954 | A1* | 5/2004 | Hembree et al. ............ 257/780 |
| 2006/0087044 | A1* | 4/2006 | Goller ........................ 257/783 |

FOREIGN PATENT DOCUMENTS

| | | |
|---|---|---|
| DE | 19642488 | 10/1996 |
| DE | 10334577 | 7/2003 |
| EP | 0273703 | 7/1988 |
| EP | 0465138 | 1/1992 |

* cited by examiner

*Primary Examiner*—Michael S Lebentritt
(74) *Attorney, Agent, or Firm*—Dicke, Billig, Czaja, PLLC

(57) ABSTRACT

The invention relates to a method for applying rewiring to a panel. For this purpose, a panel is provided which has a coplanar overall upper side of an upper side of a plastic compound and the upper sides of semiconductor chips. The method provides a rewiring layer with implementation of external contacts and rewiring lines which, by means of a two-stage exposure step, compensates for position errors of the semiconductor chips in the component positions of the panel.

23 Claims, 3 Drawing Sheets

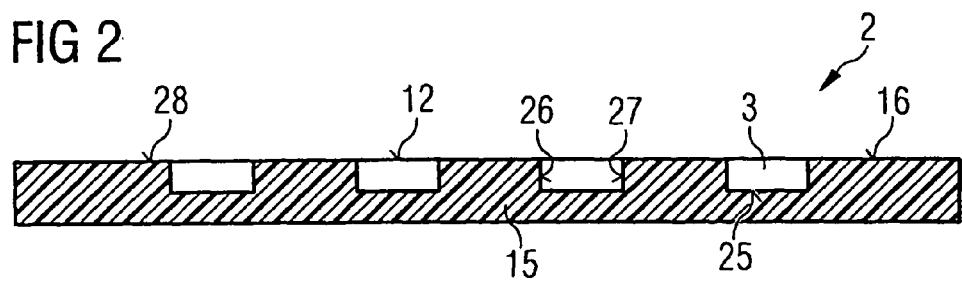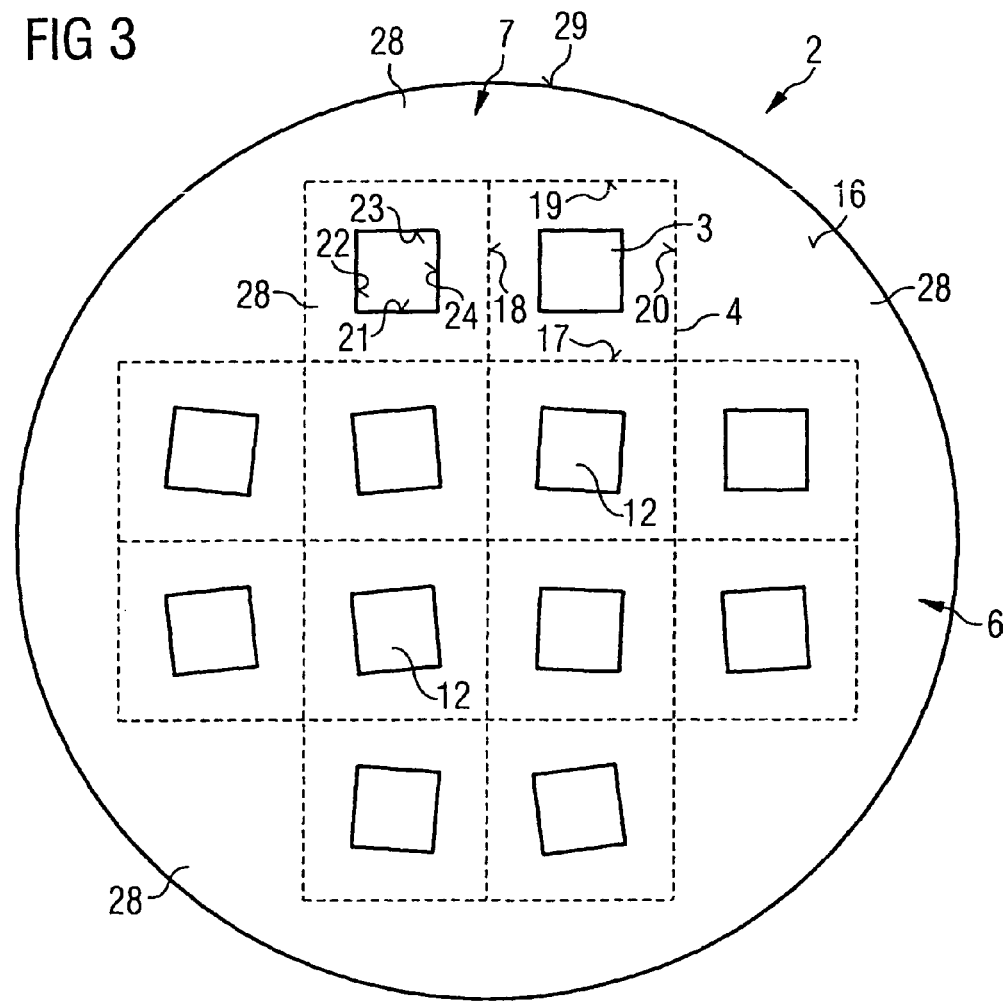

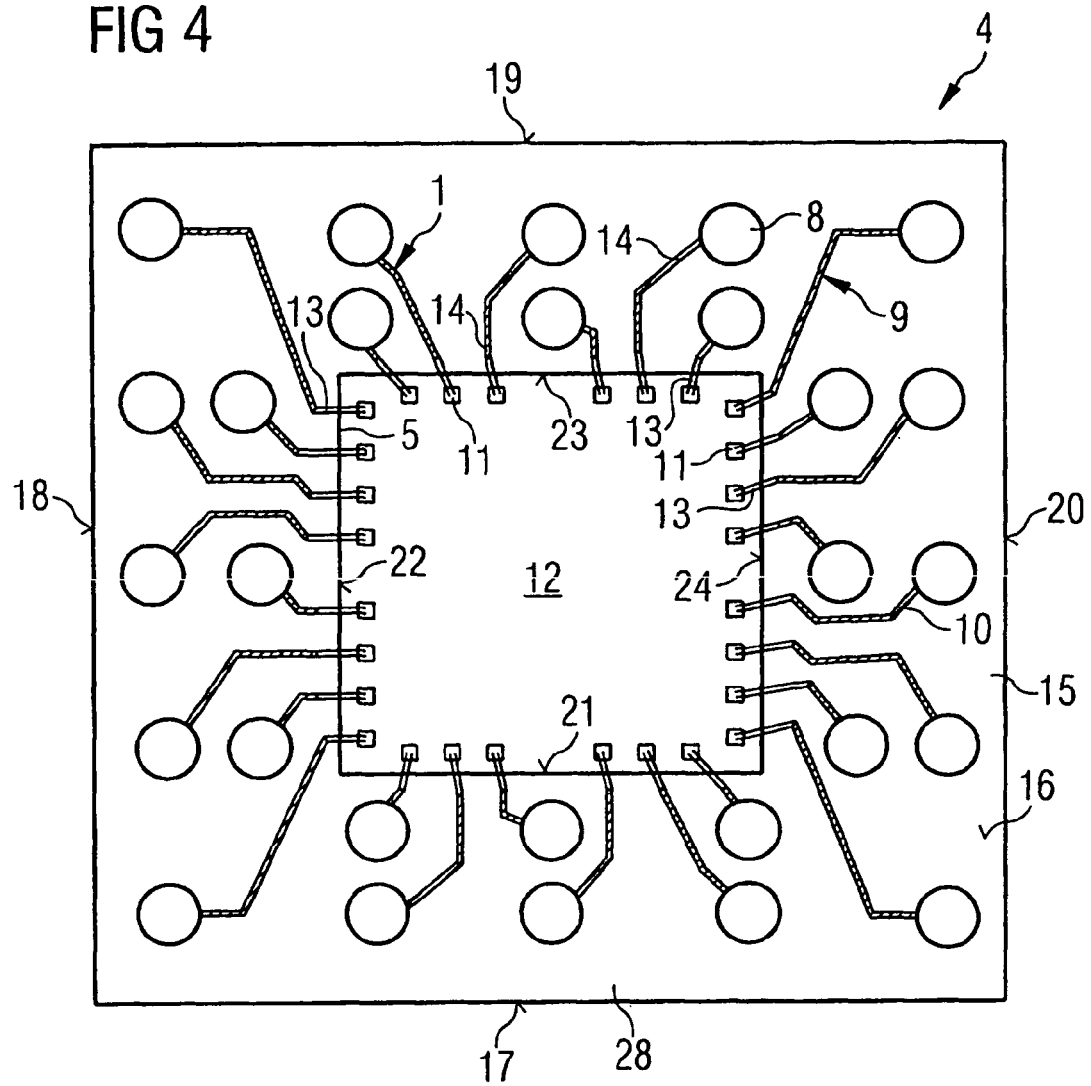

METHOD FOR APPLYING REWIRING TO A PANEL WHILE COMPENSATING FOR POSITION ERRORS OF SEMICONDUCTOR CHIPS IN COMPONENT POSITIONS OF THE PANEL

CROSS-REFERENCE TO RELATED APPLICATION

This Utility Patent Application claims the benefit of the filing date of application No. DE 103 34 577.9, filed Jul. 28, 2003 and International Application No. PCT/DE2004/001360 filed Jun. 28, 2004, both of which are herein incorporated by reference.

FIELD OF THE INVENTION

The invention relates to a method for applying rewiring to a panel while compensating for position errors of semiconductor chips in component positions of the panel.

BACKGROUND OF THE INVENTION

In applications which are based on embedding a semiconductor chip in a polymer or plastic compound in such a way that the upper sides of semiconductor chip and plastic compound form an overall upper side, such as is provided, for example, in multi-chip module technology or MCM technology or in chip-in-polymer technology, starting from the active upper sides of the semiconductor chips with their contact areas, rewiring is needed in order to connect the contact areas of the semiconductor chips to external contact areas on the overall upper side for a predefined external contact pattern. To this end, the semiconductor chips in the panel made of a plastic compound are accommodated in component positions. The component positions of the panel are arranged in rows and columns, the edges of the semiconductor chips running parallel to the columns and rows of the panel.

The rewiring in each of the component positions of the panel is implemented by rewiring layers in the form of a sequence of metal and dielectric layers. The structuring of the individual layers is carried out by means of deposition processes, which are carried out over the entire area, and by photolithography processes, in which the deposits over the entire area are structured. These photolithography processes can be carried out simultaneously for a plurality of component positions on the overall upper side of the panel if extremely close tolerances of a few micrometers are maintained when aligning the semiconductor chips in the component positions. However, within the panel, the problem arises that the chips to be wired exhibit position inaccuracies because of the population tolerances during the production of the panel. Position inaccuracies of this type can lead to considerable failures in the yield occurring with the conventional exposure processes of photolithography.

Given an order of magnitude of the contact areas of 90 µm, a minimum accuracy for the alignment of the semiconductor chips within the rows and columns of the component positions of ±25 µm must be maintained. In the event of greater position deviations of the semiconductor chips in the component positions, contact areas which are no longer reached by rewiring can already occur. Compensating for position errors of semiconductor chips in the component positions of a panel is possible by using a laser writing method, in which a photoresist layer is exposed by a write laser. However, because of the high rewiring densities required on a panel and the size of the area to be exposed for each panel, this exposure by means of scanning with a laser write beam is a time-consuming method and disadvantageously associated with high process costs.

A further possible way of compensating for position errors which go beyond a minimum tolerance compensation would be the possibility of exposing each component position individually and providing all the component positions of the panel with rewiring sequentially one after another. In this case, a mask is realigned in each of the component positions of the panel, so that, although the position errors of the chip are compensated for for the rewiring, the position error is transferred to the arrangement of the external contact areas and therefore to the external contacts that are visible from outside. This method likewise results in a low throughput as a result of the sequential processing of the panel, as compared to the use of a single overall mask which manages with one exposure process.

A further disadvantage is that, as a result of the independent adjustment of each individual installation location, although the position errors of the semiconductor chips are compensated for, the individual alignment means that a uniform grid no longer results for the matrix and the pattern of the external contacts. The external contacts of the individual component positions are then no longer located parallel to the outer edges of the semiconductor components but exhibit an X/Y offset or a rotation with respect to one another. Such a nonuniform pattern of the external contact areas on account of the position errors of the semiconductor chips also leads to problems in applying the external contacts in the form of solder globules in a compliant manner, since both the printing processes and the deposition by electroplating, and the mechanical alignment of solder globules assume a defined and reproducible pattern dimension within the context of a uniform matrix.

Following separation, in this method of the individual compensation for the position errors, an electronic component is produced with housings which have a solder globule pattern with varying positions in relation to the housing edge. This can in turn lead to problems during testing and during the further processing or the use of the electronic components in a fabrication plant if the position errors become greater than those permitted by the JEDEC Standards.

For this and other reasons, there is a need for the present invention.

SUMMARY

The invention provides a method for applying rewiring to a panel while compensating for position errors of semiconductor chips in component positions of the panel which shortens the process duration, reduces rejects and permits higher tolerances in the alignment of the semiconductor chips in rows and columns for the production of a panel.

In one embodiment, according to the invention, a method is specified for applying rewiring to a panel while compensating for position errors of semiconductor chips in component positions of the panel, the method having the following method steps. A panel is provided which has component positions arranged in rows and columns. Arranged in the component positions are semiconductor chips whose edges are not aligned accurately in accordance with the rows and columns, which results in position errors. In order to compensate for these position errors, two rewiring masks are produced, a first mask having only external contact areas for the entire panel at predetermined positions in the component positions.

A second mask has a uniform rewiring pattern having rewiring lines for the component positions for connecting contact areas on active upper sides of the semiconductor chips to external contact areas on the panel. Then, firstly the structure of the first mask is transferred to the panel with a first exposure process in order to prepare for the formation of external contact areas in the component positions. Then, optical position registration and evaluation of the position errors of the semiconductor chips in the component positions of the panel and calculation of the optimal alignment of the second mask are carried out.

After that, the second mask having the rewiring lines is carried out successively, while compensating for the position errors of the semiconductor chips in the individual component positions of the panel and while transferring the rewiring pattern of the second mask with a second exposure step in order to prepare for the formation of rewiring lines between contact areas on the semiconductor chips and external contact areas in the individual component positions of the panel.

As compared with the method described above, this method has the advantage that it manages with two exposure processes of a photolithography layer in order to compensate for the position errors of the semiconductor chips. In this case, the second mask having the rewiring lines is positioned in such a way that the rewiring lines of all the contact areas of a component position on the upper sides of the semiconductor chips of the panel meet as accurately as possible. By contrast, the outer contact areas, which are larger than the contact areas, are overlapped by the rewiring lines at arbitrary points, so that a connection is achieved between external contact areas and contact areas by using the two masks, despite position errors of the semiconductor chips.

The second mask contains the contact areas of the semiconductor chips and the rewiring to the external contact areas, and can be designed as a stepper reticle. This second mask is adjusted separately and aligned with the semiconductor chip for each component position during each stepper step. Therefore, this method, with two exposure stages, achieves improved compensation for position inaccuracies of the semiconductor chips since, in relation to the population tolerance, substantially larger external contact areas are available as compensation areas or as coupling areas for the rewiring lines.

Despite a use of a mask stepper, a fixed and defined pattern of the external contact areas in relation to the rows and columns of the panel is maintained and achieved, so that the aforementioned problems during the application of solder globules and during the division of the panel into individual components are solved by this two-stage exposure with two masks. Furthermore, the advantage results that, because of the exact alignment of the second mask in relation to the semiconductor chip and to the contact areas of the semiconductor chip, these contact areas can be made smaller. A reduction in the size of the contact areas, in addition to saving area on the silicon semiconductor chip, is associated with the possibility of implementing finer step widths or "pitches", and also a higher rewiring density, since more space becomes possible for conductor tracks between two contact areas.

While the transfer of the structure of the first mask in order to prepare external contact areas for the entire panel can be carried out by means of contact exposure, projection exposure is advantageously used for the adjustment and transfer of the structure of the second mask. In the case of projection exposure, a reticle enlarged by the factor 10 having a structure of the second mask enlarged by the factor 10 is projected onto each individual component position of the panel with a simultaneous reduction in size by the factor 10.

In a further solution to the problem of compensating for position errors of semiconductor chips within the component positions of a panel, instead of the first mask, an overall rewiring mask having external contact areas and rewiring lines is used. However, these rewiring lines do not extend as far as the contact areas of the semiconductor chip in the individual component positions, but only approximately as far as the edges of the semiconductor chips. Thus, the structure for the external contacts and for the rewiring lines is implemented to the greatest extent by the first exposure step using the overall rewiring mask. Only short line pieces between the ends of the rewiring lines in the region of the edges of the semiconductor chips and the contact areas on the active upper side of the semiconductor chip are not completed by the overall rewiring mask.

For this purpose, firstly optical position registration and evaluation of the position errors of the semiconductor chips in the component positions of the panel are carried out. This is followed, as a second exposure process, by laser structuring of connecting line pieces between the ends of the rewiring lines at the edges of the semiconductor chips and the contact areas on the active upper sides of the semiconductor chips, by means of a laser write beam. This laser structuring for the production of connecting pieces permits a greater position inaccuracy of the semiconductor chips in the individual component positions, since the compensation possibilities provided by a laser write beam, and therefore the compensation of position errors, are improved. The optical laser registration and evaluation of the position errors of the semiconductor chips in the component positions of the panel are used for the purpose of optimizing the alignment of the overall rewiring mask during the first exposure, in such a way that the smallest average distance between the ends of the rewiring lines and the contact areas on the active upper sides of the semiconductor chips is achieved. As a result, the writing period of the laser write beam is optimized and reduced, and therefore the process costs are minimized.

In this case, too, a constant grid for the external contact areas and therefore for the external housing contour is achieved with the overall rewiring mask. A further advantage is that, depending on the implementation of the writing geometry of the laser beam, position errors of different size of the chip can be evened out and compensated for. However, on account of the short writing length of the line pieces which still have to be implemented, the method is more cost-effective than complete production of the rewiring structure of the panel by laser structuring by means of a laser write beam.

The structures of the masks and/or the writing pattern of the laser write beam are coordinated with one another in such a way that, in order to transfer the entire structure onto the panel, a single photoresist layer for both exposure processes can be applied to a metal layer of the panel to be structured. In order to use and to maximize the method according to the invention optimally in both its aspects, a specific alignment strategy or adjustment strategy is carried out. The first precondition for this, as already mentioned, is the optical position registration of all the chip positions of a panel. Then, an algorithm is used to calculate the optimal position of the first or the overall rewiring mask on the basis of the smallest average offset. Next, the alignment and exposure are carried out with the aid of the first mask or else the overall rewiring mask and, finally, alignment or positioning of the write pattern of the laser beam or of the reticle of the second mask, including exposure, is necessary.

Verification that the method according to the invention has been used for semiconductor components can be carried out by means of a simple comparison of the rewiring structure which has been produced in accordance with the method of the invention with line structures which have been produced with the aid of conventional methods. In this case, it is characteristic of components which have been produced with a method of the present invention that the external contacts are arranged completely uniformly in a matrix which is aligned in accordance with the edges of the component housing. Furthermore, the line pieces produced by laser writing can be detected at any time because of their uniqueness as a result of connecting rewiring line ends to contact areas on the semiconductor chip. In addition, the characteristic attachment of the rewiring lines to the external contact areas in the case in which a first and a second mask are used can be detected at any time on the components produced.

In summary, it is to be recorded that, with the present invention, compensation for position errors of semiconductor chips can be achieved on a larger scale than was possible hitherto, and at the same time a uniformity of the external appearance of the housing and the arrangement of the external contacts can be achieved with this method, which is not possible with the previous methods or can be achieved only with a great deal of effort by means of large-area laser writing.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2 illustrates a schematic cross section through a panel for an embodiment of the invention.

FIG. 3 illustrates a schematic plan view of a panel for the embodiment according to FIG. 2.

FIG. 4 illustrates a schematic plan view of a component position of a panel according to a further example embodiment of an implementation of a method according to the invention.

DETAILED DESCRIPTION

Figure 1:
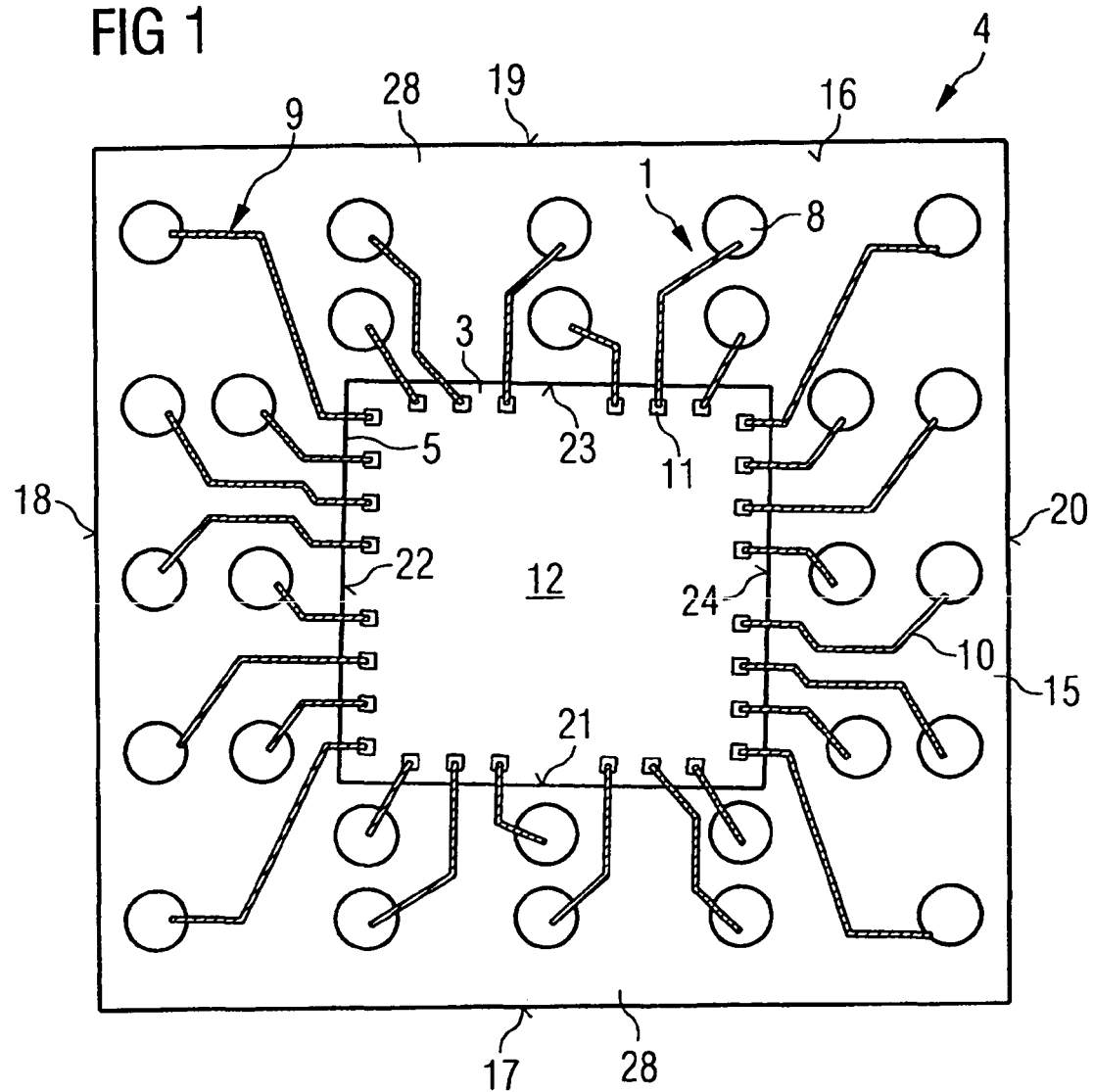
FIG. 1 illustrates a schematic plan view of a component position of a panel according to a first example embodiment of an implementation of a method of the invention.

FIG. 1 illustrates a schematic plan view of a component position 4 of a panel according to a first example of the implementation of the method of the invention. To this end, this plan view shows the overall upper side 16 of such a component position 4. This overall upper side 16 is composed of a coplanar upper side 28 of a plastic compound 15 and an active upper side 12 of a semiconductor chip 3. Rewiring 1 is arranged on the overall upper side 16.

During the production of a panel which has such a component position 4, the semiconductor chip 3 is embedded in the plastic compound 15 with its rear side and its edge sides, which cannot be seen in this plan view. During this embedding, it is possible for position inaccuracies to occur which, in this plan view, can be seen from the fact that the boundary lines 17, 18, 19 and 20 of the component position 4 do not run parallel to the edges 21, 22, 23 and 24 of the semiconductor chip 3.

By contrast, the external contact areas 8, which bear external contacts after they have been applied to the component position 4, are arranged in a matrix which is aligned in accordance with the boundary lines 17, 18, 19 and 20 of the component position 4. This is because these external contact areas 8 are aligned, adjusted and produced by using a separate first mask, which is placed over the entire panel having a plurality of component positions 4, independently of the alignment and the positioning errors of the semiconductor chip 3.

A second mask comprises only the rewiring pattern 9 with the rewiring lines 10. In each individual component position, this second mask is aligned exactly with the contact areas 11 of the active upper side 12 of the semiconductor chip 3. The area required by the contact areas 11 on the semiconductor chip 3 can therefore be minimized and the rewiring lines 10 overlap the external contact areas 8 completely differently. This method, which is carried out with two exposure processes and has two lithography processes, is able to compensate for the position errors only inasmuch as all the rewiring lines 10 still overlap their envisaged external contacts 8.

FIG. 2 illustrates a schematic cross section through a panel 2 for an embodiment of the invention. In this cross section, the panel 2 shows that it consists of a plastic compound 15, in which semiconductor chips 3 are embedded with their rear sides 25 and their edge sides 26 and 27. In this case, the upper side 12 of the semiconductor chips 3, together with the upper side 28 of the plastic compound 15, form an overall upper side 16. This overall upper side 16 can bear a rewiring layer which has external contact areas and rewiring lines.

FIG. 3 illustrates a schematic plan view of a panel 2 for the embodiment according to FIG. 2. The outer circumference 29 of the panel 2 is circular and simulates a semiconductor wafer, so that panels of this type are also called "wafer panels". The "wafer panel" illustrated here has, by way of example, 12 component positions 4, which are arranged in rows 6 and columns 7. Each of the component positions 4 in this embodiment of the invention has at its center a semiconductor chip 3 having edges 5. In this case, it can be seen that edges 21, 22, 23 and 24 or semiconductor chips to some extent exhibit an offset in the X direction and in the Y direction, that is to say laterally, with respect to the boundary lines 17, 18, 19 and 20 of each component position 4, and to some extent also occur rotated in the respective component position 4. These position errors would penetrate as far as the arrangement of external contact areas and therefore have the effect of different outlines of the housings of the semiconductor components if the position errors cannot be compensated for by the present invention. In order to compensate for these errors, FIG. 4 illustrates a further exemplary embodiment.

FIG. 4 illustrates a schematic plan view of a component position 4 of a panel according to a further example of the implementation of the invention. Components having the same functions as in the preceding figures are identified by the same designations and not specifically explained.

The rewiring pattern 9 shown here, comprising external contact areas 8, rewiring lines 10 and contact areas 11 on the semiconductor chip 3, also compensates for a position error of the semiconductor chip 3 within the component position 4. In this example of the implementation of the method, both external contact areas 8 and rewiring lines 10 are predefined on a first mask, which is structured for the entire panel. However, the rewiring lines do not reach as far as the contact areas 11 of the semiconductor chip 3 but have an end 14 which is arranged still in front of the edges 21, 22, 23 and 24 of the semiconductor chip 3.

The contact areas 11 on the active upper side 12 of the semiconductor chip 3 thus cannot be connected to the external contact areas 8 by using one exposure step with the aid of this overall rewiring mask. Instead, by using a second exposure process, the contact areas 11 are connected to the ends 14 of the rewiring lines 10 via line pieces 13. These line pieces 13 are produced by exposure by means of a laser write beam. In this way, considerably greater position errors of the semiconductor chips 3 in the component positions 4 can be compensated for, since the adaptation by line pieces 13 by means of laser writing or laser structuring provides great flexibility.

The invention claimed is:

1. A method for applying rewiring to a panel while compensating for position errors of semiconductor chips in component positions of the panel, comprising:
providing a panel having component positions having arranged in the component positions semiconductor chips that have position errors; and
producing two rewiring masks for compensating for position errors of the semiconductor chips, a first mask having only external contact areas for the entire panel at predetermined positions in the component positions, and a second mask having a uniform rewiring pattern having rewiring lines for an individual component position for connecting contact areas on active upper sides of the semiconductor chips to the external contact areas.

2. The method of claim 1, comprising:
transferring the structure of the first mask to the panel with a first exposure in order to prepare for the formation of external contact areas in the component positions.

3. The method of claim 2, comprising:
optical position registration and evaluation of the position errors of the semiconductor chips in the component positions of the panel and calculation of the optimal alignment of the second mask.

4. The method of claim 3, comprising:
adjusting the second mask, while successively compensating for the position errors of the semiconductor chips in the individual component positions of the panel.

5. The method of claim 4, comprising:
wherein adjusting the second mask further includes successively transferring the rewiring pattern of the second mask with a second exposure in order to prepare for the formation of rewiring lines between contact areas on the semiconductor chips and external contact areas in the individual component positions of the panel.

6. The method of claim 1, comprising:
optical position registration and evaluation of the position errors of the semiconductor chips in the component positions of the panel and calculation of the optimal alignment of the second mask.

7. The method of claim 1, comprising:
adjusting the second mask, while successively compensating for the position errors of the semiconductor chips in the individual component positions of the panel.

8. The method of claim 7, comprising:
wherein adjusting the second mask further includes successively transferring the rewiring pattern of the second mask with a second exposure in order to prepare for the formation of rewiring lines between contact areas on the semiconductor chips and external contact areas in the individual component positions of the panel.

9. The method of claim 8, comprising wherein the adjustment and transfer of the structure of the second mask is carried out by means of projection exposure.

10. The method of claim 8, comprising wherein the transfer of the structure of a mask for the entire panel is carried out by means of contact exposure.

11. The method of claim 8, comprising wherein the laser structuring is carried out successively and individually for each connecting line piece.

12. A method for applying rewiring to a panel while compensating for position errors of semiconductor chips in component positions of the panel, the method comprising:
providing a panel which has component positions arranged in rows and columns, there being arranged in the component positions semiconductor chips whose edges are not aligned accurately in accordance with the rows and columns, so that they have position errors;
producing an overall rewiring mask having external contact areas and rewiring lines approximately as far as edges of the semiconductor chips in the direction of contact areas on active upper sides of the semiconductor chips for the entire panel;
optical position registration and evaluation of the position errors of the semiconductor chips in the component positions of the panel;
transferring the overall rewiring mask to the panels by using a first exposure process in order to prepare for the formation of external contact areas and of rewiring lines approximately as far as the edges of the semiconductor chips in the component positions;
laser-structuring connecting line pieces between the ends of the rewiring lines approximately at the edges of the semiconductor chips and the contact areas on the active upper sides of the semiconductor chips by using a second exposure process by means of a laser write beam.

13. The method of claim 12, comprising wherein the adjustment and transfer of the structure of the second mask is carried out by means of projection exposure.

14. The method of claim 12, comprising wherein the transfer of the structure of a mask for the entire panel is carried out by means of contact exposure.

15. A method for applying rewiring to a panel while compensating for position errors of semiconductor chips in component positions of the panel, the method comprising:
providing a panel which has component positions arranged in rows and columns, there being arranged in the component positions semiconductor chips whose edges are not aligned accurately in accordance with the rows and columns, so that they have position errors;
producing two rewiring masks, a first mask having only external contact areas for the entire panel at predetermined positions in the component positions, and a second mask having a uniform rewiring pattern having rewiring lines for an individual component position for connecting contact areas on active upper sides of the semiconductor chips to the external contact areas;
transferring the structure of the first mask to the panel with a first exposure step in order to prepare for the formation of external contact areas in the component positions;
optical position registration and evaluation of the position errors of the semiconductor chips in the component positions of the panel and calculation of the optimal alignment of the second mask;
adjusting the second mask, while successively compensating for the position errors of the semiconductor chips in the individual component positions of the panel and while successively transferring the rewiring pattern of the second mask with a second exposure step in order to prepare for the formation of rewiring lines between contact areas on the semiconductor chips and external contact areas in the individual component positions of the panel.

16. The method of claim 15, comprising wherein the laser structuring is carried out successively and individually for each connecting line piece.

17. The method of claim 15, comprising wherein the adjustment and transfer of the structure of the second mask is carried out by means of projection exposure.

18. The method of claim 15, comprising wherein the transfer of the structure of a mask for the entire panel is carried out by means of contact exposure.

19. The method of claim 15, comprising wherein the laser structuring is carried out successively and individually for each connecting line piece.

20. A system for applying rewiring to a panel while compensating for position errors of semiconductor chips in component positions of the panel, comprising:
- means for providing a panel having component positions arranged in rows and columns, there being arranged in the component positions semiconductor chips whose edges are not aligned accurately in accordance with the rows and the columns, so that they have position errors; and
- means for producing two rewiring masks for compensating for position errors of the semiconductor chips, a first mask having only external contact areas for the entire panel at predetermined positions in the component positions, and a second mask having a uniform rewiring pattern having rewiring lines for an individual component position for connecting contact areas on active upper sides of the semiconductor chips to the external contact areas.

21. The system of claim 20, comprising:
- means for transferring the structure of the first mask to the panel with a first exposure in order to prepare for the formation of external contact areas in the component positions.

22. The method of claim 20, comprising:
- means for optical position registration and evaluation of the position errors of the semiconductor chips in the component positions of the panel and calculation of the optimal alignment of the second mask.

23. The method of claim 20, comprising:
- means for adjusting the second mask, while successively compensating for the position errors of the semiconductor chips in the individual component positions of the panel, wherein adjusting the second mask further includes successively transferring the rewiring pattern of the second mask with a second exposure in order to prepare for the formation of rewiring lines between contact areas on the semiconductor chips and external contact areas in the individual component positions of the panel.

* * * * *